United States Patent
Kuo et al.

(10) Patent No.: US 11,800,650 B2
(45) Date of Patent: Oct. 24, 2023

(54) PIN-ALIGNED MAGNETIC DEVICE

(71) Applicant: ITG Electronics, Inc., New Taipei (TW)

(72) Inventors: Martin Kuo, New Taipei (TW); Nanhai Zhu, New Taipei (TW)

(73) Assignee: ITG ELECTRONICS, INC., New Taipei (TW)

( * ) Notice: Subject to any disclaimer, the term of this patent is extended or adjusted under 35 U.S.C. 154(b) by 335 days.

(21) Appl. No.: 17/218,343

(22) Filed: Mar. 31, 2021

(65) Prior Publication Data

US 2022/0322539 A1 Oct. 6, 2022

(51) Int. Cl.
*H05K 3/30* (2006.01)

(52) U.S. Cl.
CPC ....... *H05K 3/303* (2013.01); *H05K 2203/104* (2013.01); *H05K 2203/167* (2013.01)

(58) Field of Classification Search
CPC .. H01F 17/04; H01F 2005/043; H01F 27/292; H01F 27/306; H01F 5/04; H01F 17/06; H01F 27/006; H01F 27/2847; H01F 3/12; H01F 2038/006; H05K 1/111; H05K 3/303; H05K 3/3426; H05K 3/30; H05K 2201/1003; H05K 2203/104; H05K 2203/167; H02M 7/003
USPC .......................................... 174/68.1; 336/233
See application file for complete search history.

(56) References Cited

U.S. PATENT DOCUMENTS

| | | | |
|---|---|---|---|
| 2005/0077078 A1* | 4/2005 | Holmes | H05K 1/028 174/254 |
| 2010/0032193 A1* | 2/2010 | Lee | H05K 1/111 174/260 |
| 2010/0176909 A1* | 7/2010 | Yasuda | H01F 27/006 336/233 |
| 2018/0211754 A1* | 7/2018 | Hattori | H01F 17/0013 |

FOREIGN PATENT DOCUMENTS

JP     2003102119 A   *   4/2003  ............. H01R 31/06

* cited by examiner

*Primary Examiner* — Timothy J Thompson
*Assistant Examiner* — Guillermo J Egoavil
(74) *Attorney, Agent, or Firm* — Li & Cai Intellectual Property (USA) Office (57) ABSTRACT

A pin-aligned magnetic device is provided, which includes a first magnetic core body, a second magnetic core body, and a plurality of conductors. The first magnetic core body is internally disposed with a magnetic element, and the magnetic element is joined to the plurality of conductors. The second magnetic core body covers the plurality of conductors on the first magnetic core body, so that the plurality of conductors is mounted inside the magnetic device and pins thereof are exposed from two lateral sides of the magnetic device, to form a plurality of pins. The foregoing design makes room at the bottom of the magnetic device, thus facilitating space saving and utilization on a PCB board. Moreover, each pin can be in good electrical contact with the board, effectively enhancing product yield on a production line.

9 Claims, 12 Drawing Sheets

PIN-ALIGNED MAGNETIC DEVICE

FIELD OF THE DISCLOSURE

The present disclosure relates to a pin-aligned magnetic device, and more particularly to a pin-aligned magnetic device of which externally exposed pins are aligned at the bottom during packaging of the magnetic device or a magnetic element.

BACKGROUND OF THE DISCLOSURE

Generally, in an overall structure of an existing magnetic element or magnetic device, it is often not easy to align pins during manufacturing of the device/element. On the other hand, if it is required to assemble a plurality of coils together on the same core body, how to align the pins after assembly of these coils is one of the key points in the production technology of the magnetic device. More specifically, if the pins of the magnetic element or magnetic device are not aligned, some of the pins may not be connected when the magnetic device is automatically placed by a machine on a PCB board on a production line of the magnetic element or magnetic device, rendering the whole magnetic device scrap and thus greatly lowering the production yield of the machine. Therefore, it is required to make improvements.

SUMMARY OF THE DISCLOSURE

The present disclosure provides a pin-aligned magnetic device, which can effectively overcome the shortcoming that the pins cannot be aligned in the prior art. The present disclosure makes improvements to the existing magnetic device or a passive element related to a magnetic circuit, and designs the structure of pins during manufacturing of the magnetic device, so that the pins are uniformly aligned at the bottom after completion. Moreover, the pins can be heightened at the bottom, that is, the bottoms of the pins exceed the bottom of the magnetic device and extend downwards, thus making room at the bottom of the magnetic device and facilitating space saving and utilization on a PCB board. When the magnetic device is placed on the PCB board with a mechanical appliance of an automated machine, all the pins can be in good contact with the PCB board, improving the electrical characteristics of the circuit product and further enhancing product yield on the production line.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The present disclosure discloses a pin-aligned magnetic device, which designs the structure of pins during manufacturing of a magnetic device, so that the pins are uniformly aligned at the bottom after completion. Moreover, the pins can be heightened at the bottom, that is, the bottoms of the pins exceed the bottom of the magnetic device and extend downwards, thus making room at the bottom of the magnetic device and facilitating space saving and utilization on a PCB board. When the magnetic device is placed on the PCB board with a mechanical appliance of an automated machine, all the pins can be in good contact with the PCB board, improving the electrical characteristics of the circuit product and further enhancing product yield on the production line.

Figure 1:
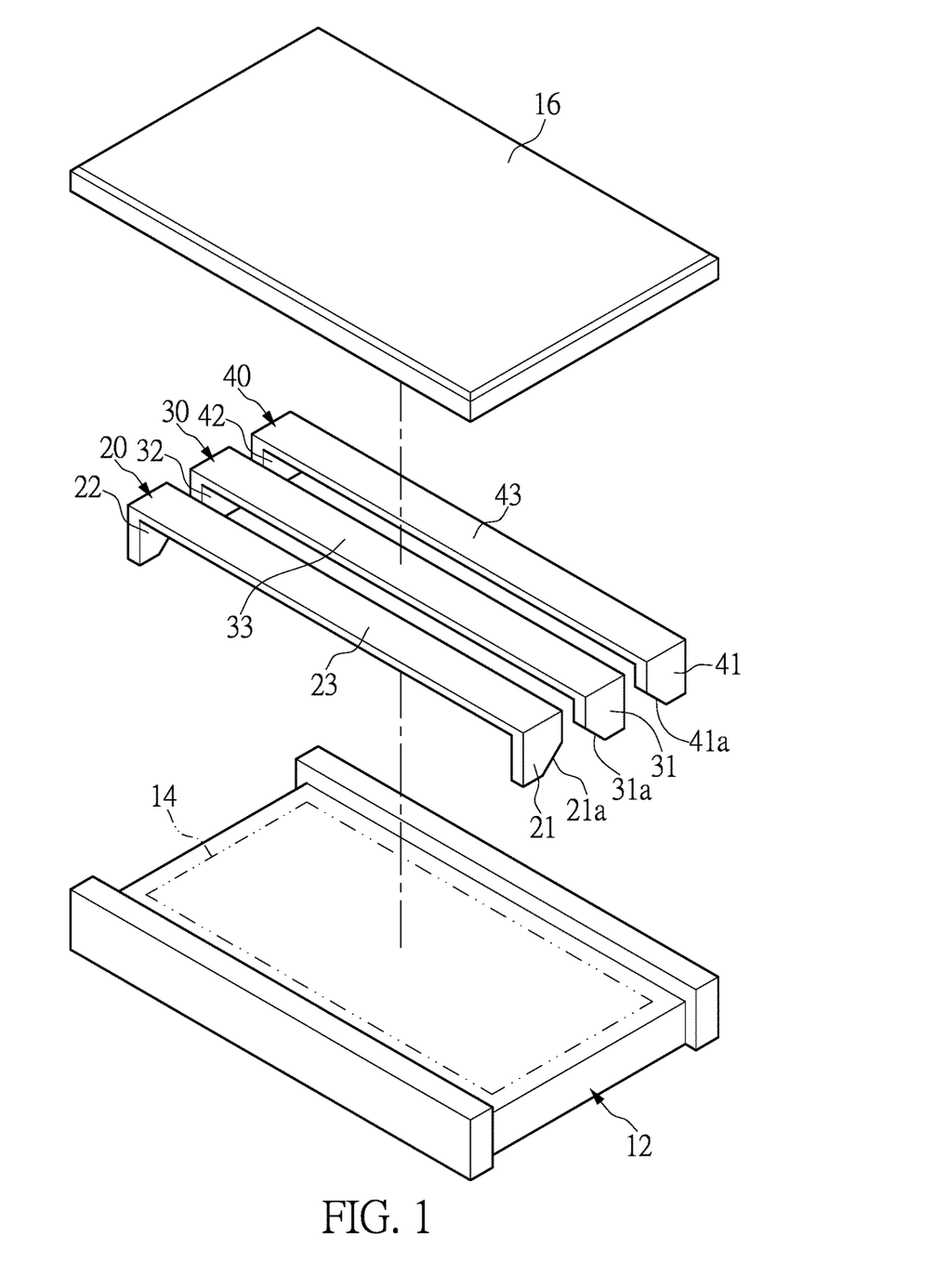
FIG. 1 is a schematic exploded diagram of an embodiment of the present disclosure.
Figure 2:
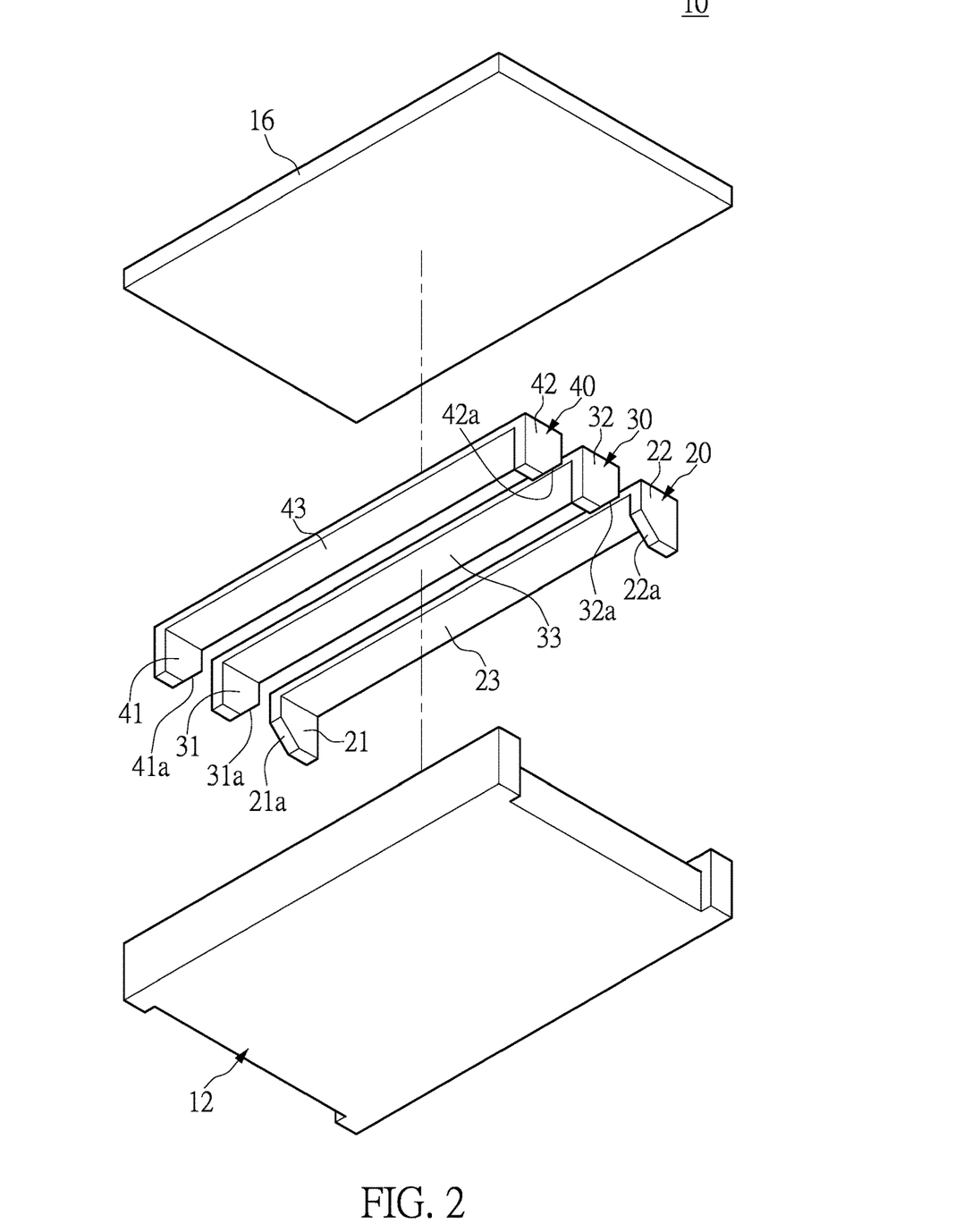
FIG. 2 is a schematic exploded diagram of an embodiment of the present disclosure from another viewing angle.

Refer to FIGS. 1 and 2, which are respectively a schematic exploded diagram of an embodiment of a pin-aligned magnetic device and a schematic exploded diagram from another viewing angle of FIG. 1. In this embodiment, the magnetic device 10 includes a first magnetic core body 12, a second magnetic core body 16, and a plurality of conductors (as denoted by numerals 20, 30, and 40), where the second magnetic core body 16 is disposed above the first magnetic core body 12. It should be noted that, the first magnetic core body 12 and the second magnetic core body 16 described in this embodiment are not integrally formed. However, in another possible embodiment, the first magnetic core body 12 and the second magnetic core body 16 may be designed into an integrally formed structure, namely, a whole structure without the arrangement of the second magnetic core body, which is not limited in the present disclosure. In addition, a magnetic element 14 is disposed in the first magnetic core body 12 and is shown by dashed lines in FIG. 1. The use of the dashed lines means that the present disclosure does not limit an internal structure of the magnetic element 14. The magnetic element 14 includes a plurality of coils and a plurality of magnetic cores. There may be three sets of coils in an embodiment, and the number is not limited in the present disclosure provided that the coils can be joined to the plurality of conductors (as denoted by numerals 20, 30, and 40). The magnetic element may be, but is not limited to, a single-inductor, double-inductor, multi-inductor, coupled, or uncoupled element, which may be one of possible embodiments of the magnetic element 14 described in the present disclosure.

The plurality of conductors in the embodiment of FIGS. 1 and 2 includes a first conductor 20, a second conductor 30, and a third conductor 40. In another possible embodiment, the number of the conductors may be increased to 5 or 7 by a user. That is, the present disclosure does not limit the number of the conductors. The first conductor 20, the second conductor 30, and the third conductor 40 are all disposed between the first magnetic core body 12 and the second magnetic core body 16, are correspondingly joined or connected to the magnetic element 14, and are roughly arranged at intervals. The second magnetic core body 16 covers the first conductor 20, the second conductor 30, and the third conductor 40 on the first magnetic core body 12, so that the first conductor 20, the second conductor 30, and the third conductor 40 are mounted inside the magnetic device 10 and pins thereof are exposed from two lateral sides of the magnetic device 10. As shown in FIGS. 1 and 2, a first pin 21, a second pin 22, a third pin 31, a fourth pin 32, a fifth pin 41, and a sixth pin 42 are disclosed.

Figure 4A:
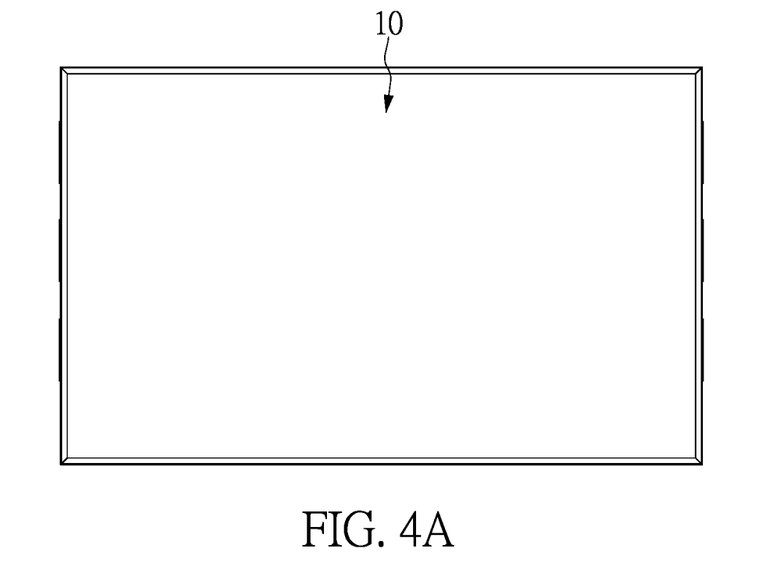
FIG. 4A is a schematic top view of an embodiment of the present disclosure.
Figure 4B:
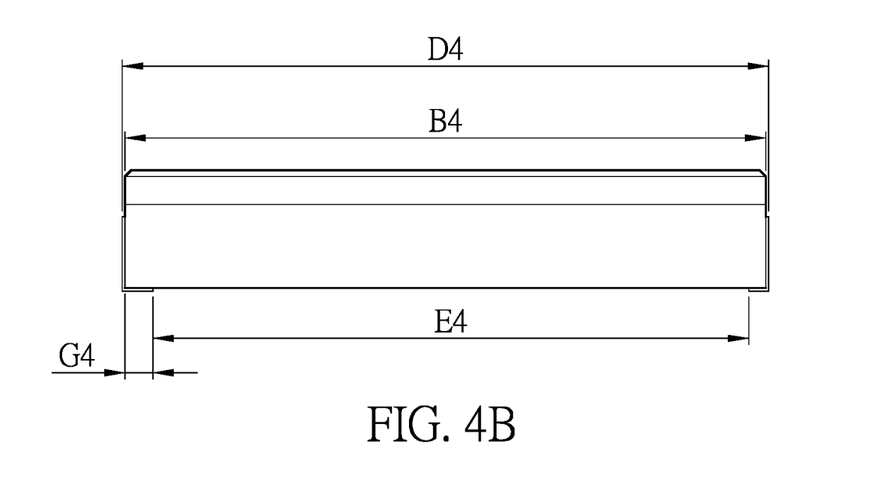
FIG. 4B is a schematic front view of an embodiment of the present disclosure.

On the other hand, in the embodiment of the present disclosure, the first pin 21, the second pin 22, the third pin 31, the fourth pin 32, the fifth pin 41, and the sixth pin 42 are uniformly aligned at the bottom, and are each provided with a cut portion on a lateral side at the bottom. The cut portion may form a chamfer, as shown in FIGS. 4C and 4D; in addition, the cut portion in the present disclosure may also form a notch, as shown in FIGS. 4E and 4F.

Referring to FIGS. 1, 2, 3, and 4C, when the cut portion of each pin is a chamfer, the first pin 21 is provided with a first chamfer 21a, the second pin 22 is provided with a second chamfer 22a, the third pin 31 is provided with a third chamfer 31a, the fourth pin 32 is provided with a fourth chamfer 32a, the fifth pin 41 is provided with a fifth chamfer 41a, and the sixth pin 42 is provided with a sixth chamfer 42a. Moreover, the first pin 21, the second pin 22, the third pin 31, the fourth pin 32, the fifth pin 41, and the sixth pin 42 are aligned at the bottom. That is, when the pin-aligned magnetic device 10 of the present disclosure is used for automated production of circuit elements in a factory, each pin exactly contacts a corresponding soldering pad on a PCB board when the magnetic device 10 is placed on the PCB board, or each pin is exactly inserted into a soldering hole in the corresponding soldering pad, so as to avoid a pin connection failure.

Figure 3:
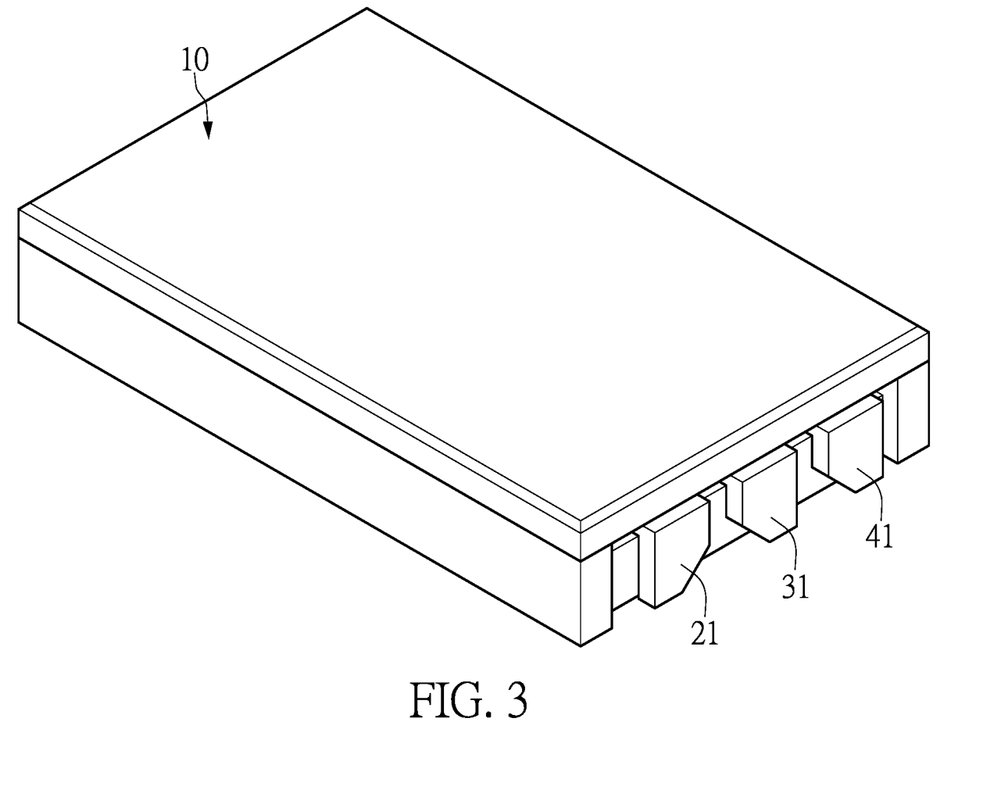
FIG. 3 is a schematic perspective diagram of an embodiment of the present disclosure.
Figure 4C:
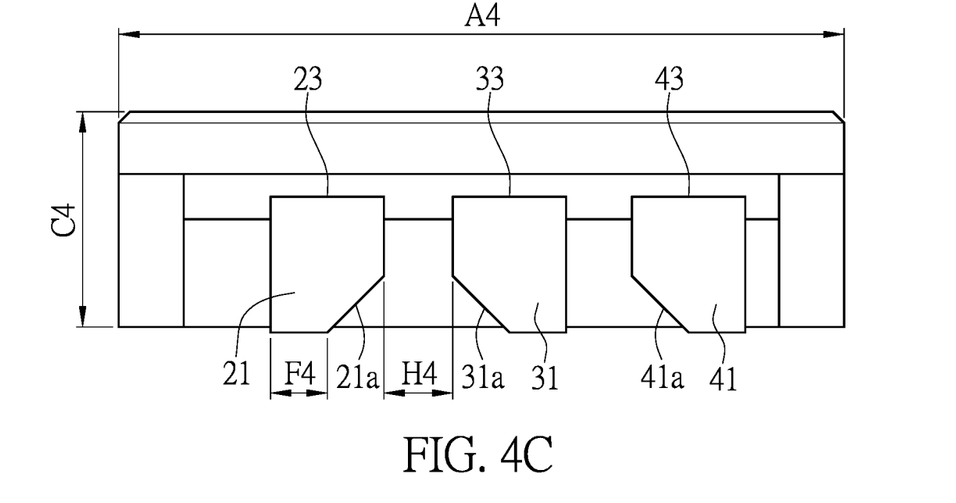
FIG. 4C is a schematic right view of an embodiment of the present disclosure.
Figure 5A:
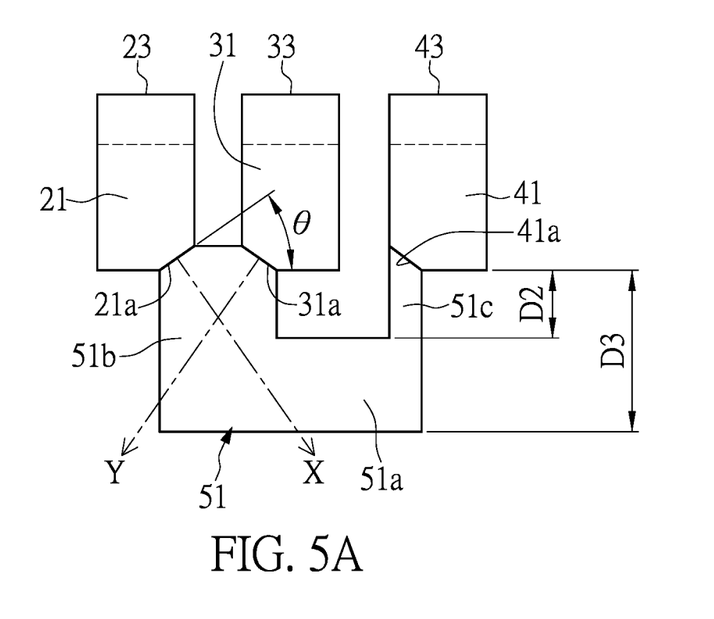
FIG. 5A is a schematic diagram of right-view dimensions in a conductor embodiment of the present disclosure.
Figure 5B:
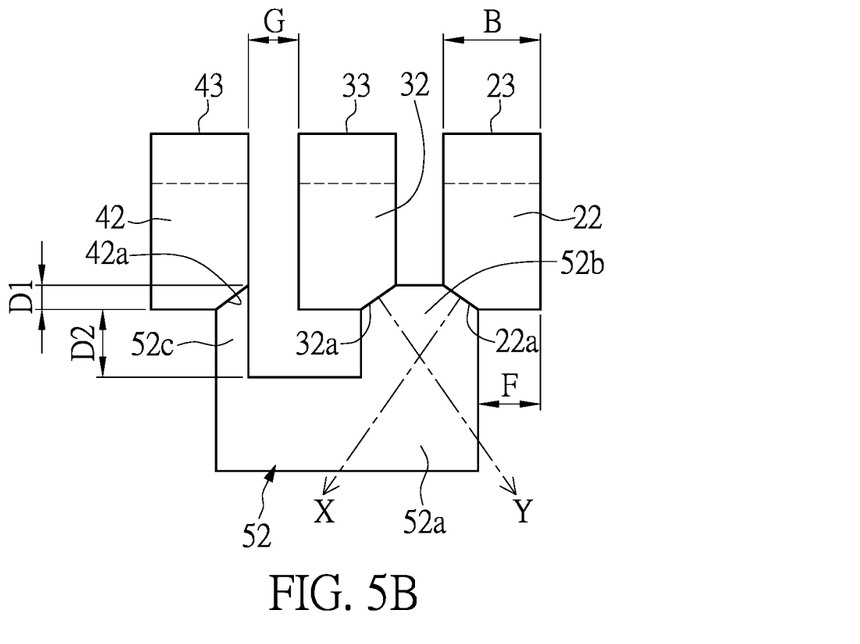
FIG. 5B is a schematic diagram of left-view dimensions in the conductor embodiment of the present disclosure.

In FIGS. 1, 2, 3, and 4C, the first chamfer 21a and the second chamfer 22a have the same orientations and both face a first direction X (as shown in FIGS. 5A and 5B), that is, the first direction X is identical with normal directions of the first chamfer 21a and the second chamfer 22a. The third chamfer 31a, the fourth chamfer 32a, the fifth chamfer 41a, and the sixth chamfer 42a have the same orientations and all face a second direction Y (as shown in FIGS. 5A and 5B), that is, the second direction Y is identical with normal directions of the third chamfer 31a, the fourth chamfer 32a, the fifth chamfer 41a, and the sixth chamfer 42a. In an embodiment, the first direction X and the second direction Y are mutually perpendicular. However, the present disclosure does not limit an included angle between the first direction X and the second direction Y, but merely reveals that the first direction X and the second direction Y have an intersection. The present disclosure does not pose any limitation on the angle between the first direction X and the second direction Y.

Figure 4D:
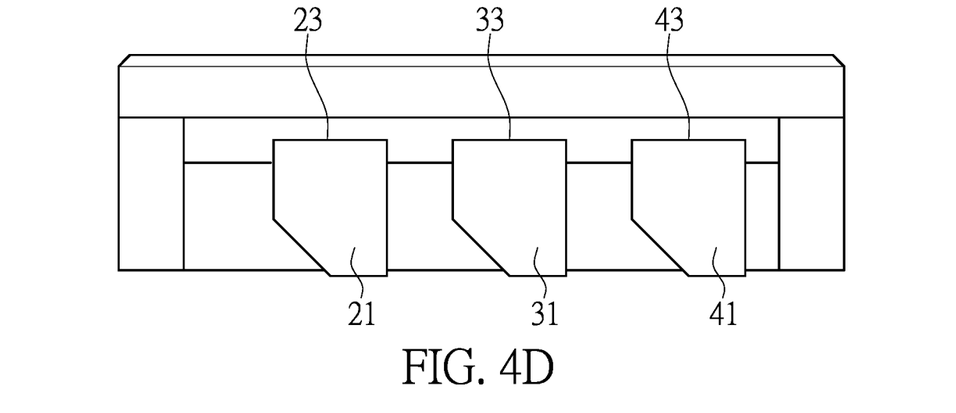
FIG. 4D, corresponding to FIG. 4C, is a schematic right view of another embodiment of the present disclosure.
Figure 4E:
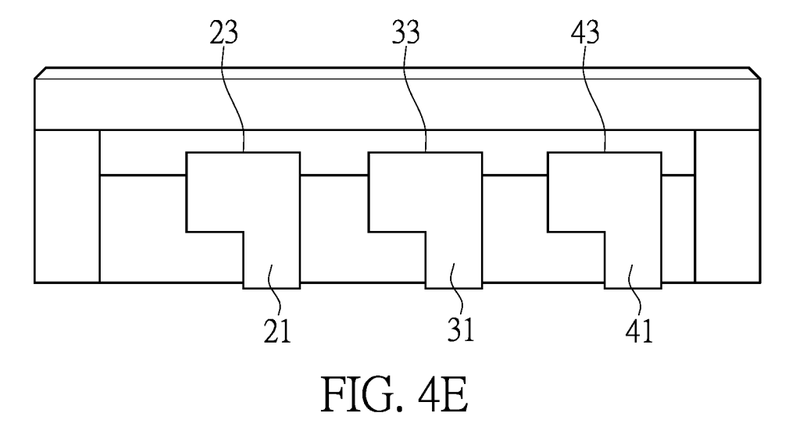
FIG. 4E, corresponding to FIG. 4D, is a schematic right view of yet another embodiment of the present disclosure.
Figure 4F:
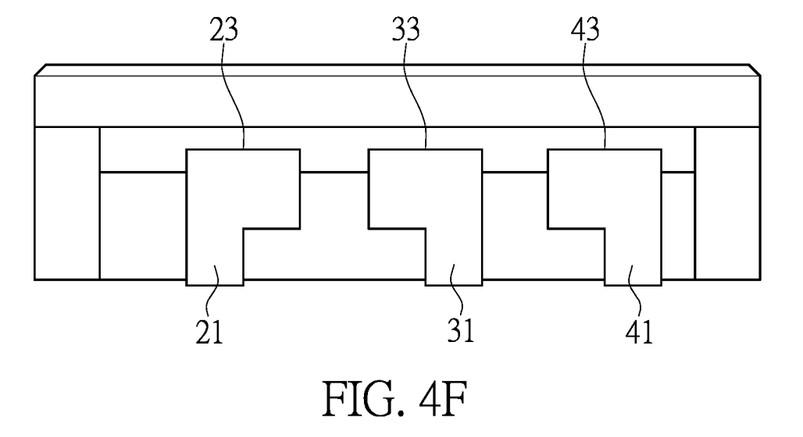
FIG. 4F, corresponding to FIG. 4E, is a schematic right view of still another embodiment of the present disclosure.

On the other hand, a difference between an embodiment shown in FIG. 4D and that in FIG. 4C lies in that, the first chamfer 21a, the second chamfer 22a, the third chamfer 31a, the fourth chamfer 32a, the fifth chamfer 41a, and the sixth chamfer 42a all have the same orientations. In addition, in an embodiment shown in FIG. 4E, the cut portion may also be a notch. Specifically, FIG. 4E shows that the cut portion is an inverted L-shaped notch, and in this case, the first to sixth pins are still uniformly aligned and further flattened at the very bottom (portions contacting the PCB board). In addition, the inverted L-shaped notches of the first to sixth pins in FIG. 4E all have the same orientations. In an embodiment shown in FIG. 4F, the inverted L-shaped notches of the first and second pins 21 and 22 both face the first direction X, while those of the third pin 31, the fourth pin 32, the fifth pin 41, and the sixth pin 42 all face the second direction Y. The embodiments of the present disclosure are shown in FIGS. 4C, 4D, 4E, and 4F, that is, the present disclosure does not limit a structural shape of the cut portion.

FIGS. 1 and 2 further show that the first conductor 20 includes the first pin 21, the second pin 22, and a first main body 23, where the first main body 23 is an elongated shape. The two ends of the first main body 23 that extend towards the two sides are further vertically bent downwards, to form the first pin 21 and the second pin 22. Likewise, the second conductor 30 includes the third pin 31, the fourth pin 32, and a second main body 33, where the second main body 33 is an elongated shape. The two ends of the second main body 33 that extend towards the two sides are further vertically bent downwards, to form the third pin 31 and the fourth pin 32. The third conductor 40 includes the fifth pin 41, the sixth pin 42, and a third main body 43, where the third main body 43 is an elongated shape. The two ends of the third main body 43 that extend towards the two sides are further vertically bent downwards, to form the fifth pin 41 and the sixth pin 42. As shown in FIGS. 1 and 2, the first main body 23, the second main body 33, and the third main body 43 are equally spaced and mounted on the first magnetic core body 12; and then the second magnetic core body 16 are placed thereon to cover them, to finally form the magnetic device 10 of the present disclosure after assembly.

Refer to FIG. 3, which is a schematic perspective diagram of the exterior of the magnetic device 10 formed after assembly according to the content described in FIGS. 1 and 2. FIG. 4A is a top view of the magnetic device 10 in an embodiment of the present disclosure. FIG. 4B is a schematic front view of the magnetic device 10 in an embodiment of the present disclosure, where D4 is the length of an outer edge of a top surface of the magnetic device 10, B4 is the length of an inner edge of the top surface of the magnetic device 10, E4 is a distance between inner edges of the pins at the two sides of the bottom of the magnetic device 10, and G4 is a side-view thickness of the pins at the bottom of the magnetic device 10. FIG. 4C is a schematic right view of the magnetic device 10 in an embodiment of the present disclosure, where A4 is the width of the outer edge of the top surface of the magnetic device 10, C4 is the thickness of the magnetic device 10 excluding the pins, F4 is the width of the very bottom of the first pin 21, and H4 is an interval between the first main body 20 and the second main body 30. In an embodiment, reference is made to table 1 for the dimensions in FIGS. 4B and 4C, but the dimensions of an actually produced magnetic device 10 of the present disclosure are not limited to the numeric values in the following table 1.

TABLE 1

| | Numeric values | Notes | Units |
|---|---|---|---|
| A4 | 13.10 | (Max) | mm |
| B4 | 20.95 | (Max) | mm |
| C4 | 5.02 | (Max) | mm |
| D4 | 21.00 | (Max) | mm |
| E4 | 18.70 | (Ref.) | mm |
| F4 | 1.00 | ±0.20 | mm |
| G4 | 1.00 | ±0.20 | mm |
| H4 | 1.00 | | mm |

On the other hand, during actual production of the present disclosure, in a case where the final device has not yet been completed in a process of forming the first conductor 20, the second conductor 30, and the third conductor 40, a first removable alignment material 51 and a second removable alignment material 52 are further included. FIG. 5A is a schematic diagram of right-view dimensions in a conductor embodiment of the present disclosure, and FIG. 5B is a schematic diagram of left-view dimensions in a conductor embodiment of the present disclosure. As described above, during production of the first conductor 20, the second conductor 30, and the third conductor 40, the first removable alignment material 51 (as shown in FIG. 5A) and the second removable alignment material 52 (as shown in FIG. 5B) are further provided before a final product is formed. A side of the first removable alignment material 51, which refers to an upper side of the first removable alignment material 51 in FIG. 5A, is connected to the first chamfer 21a, the third chamfer 31a, and the fifth chamfer 41a. Pre-designed creases are provided at joints respectively, which are shown by the dotted lines at the chamfers in FIG. 5A. Likewise, a side of the second removable alignment material 52, which refers to an upper side of the second removable alignment material 52 in FIG. 5B, is connected to the second chamfer 22a, the fourth chamfer 32a, and the sixth chamfer 42a. Pre-designed creases are also provided at joints respectively, which are shown by the dotted lines at the chamfers in FIG. 5B.

Further, the first removable alignment material 51 in FIG. 5A includes a base 51a, a first protrusion portion 51b, and a second protrusion portion 51c, where the base 51a is a basal part of the first removable alignment material 51 and is roughly a long rectangle shape, as shown in FIG. 5A. The first protrusion portion 51b protrudes and extends upwards from an upper left side of the base 51a, and two lateral sides of the top end of the first protrusion portion 51b are exactly joined to the first chamfer 21a and the third chamfer 31a respectively. The second protrusion portion 51c protrudes and extends upwards from an upper right side of the base 51a, and the top end of the second protrusion portion 51c is exactly joined to the fifth chamfer 41a.

In FIG. 5B, the second removable alignment material 52 includes a base 52a, a first protrusion portion 52b, and a second protrusion portion 52c, where the base 52a is a basal part of the second removable alignment material 52 and is roughly a long rectangle shape, as shown in FIG. 5B. The first protrusion portion 52b protrudes and extends upwards from an upper right side of the base 52a, and two lateral sides of the top end of the first protrusion portion 52b are exactly joined to the second chamfer 22a and the fourth chamfer 32a respectively. The second protrusion portion 52c protrudes and extends upwards from an upper left side of the base 52a, and the top end of the second protrusion portion 52c is joined to the sixth chamfer 42a.

Figure 5C:
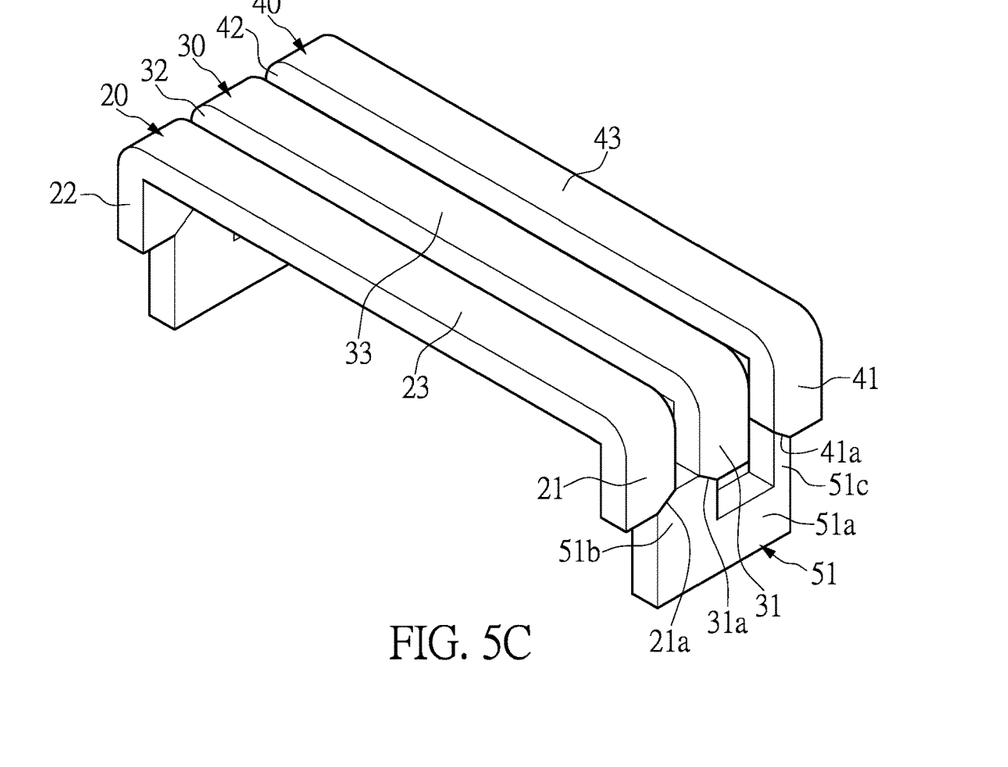
FIG. 5C is a schematic perspective diagram of FIG. 5A in the conductor embodiment of the present disclosure.

FIG. 5C is a schematic perspective diagram of FIG. 5A, and clearly shows that the plurality of conductors such as the first conductor 20, the second conductor 30, and the third conductor, and the first removable alignment material 51 and the second removable alignment material 52 together form an integral structural element. After the whole magnetic device 10 is finished and vertical pins are formed by bending, the first removable alignment material 51 and the second removable alignment material 52 are cut away together. Moreover, because there are pre-designed creases between the first removable alignment material 51 and its corresponding chamfers, and between the second removable alignment material 52 and its corresponding chamfers, after the first removable alignment material 51 and the second removable alignment material 52 are cut away along the pre-designed creases, the first to sixth pins 21, 22, 31, 32, 41, and 42 are aligned and flattened at the bottom, achieving desired flatness and levelness of the pins.

Figure 6:
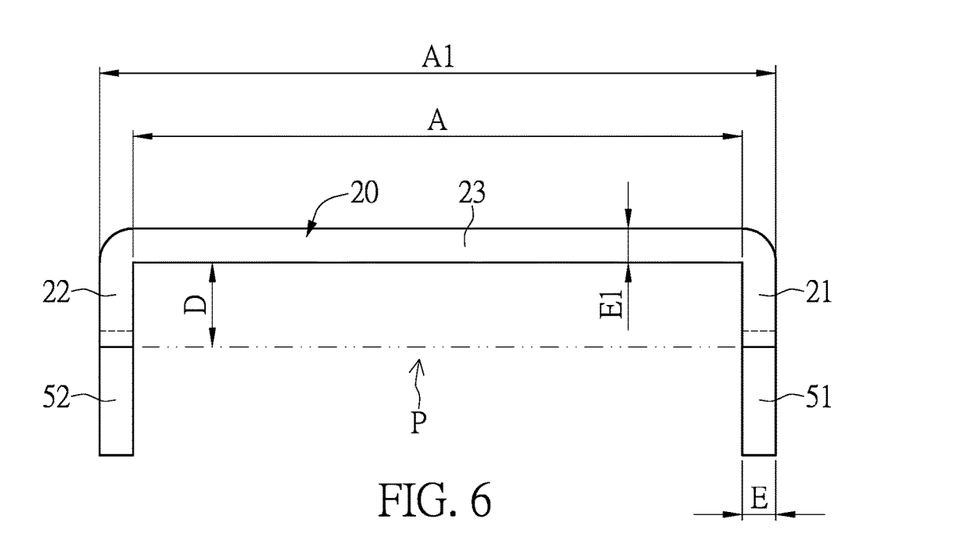
FIG. 6 is a schematic diagram of front-view dimensions in the conductor embodiment of the present disclosure.

FIG. 6 is a schematic side view of FIGS. 5A, 5B, and 5C, where P denotes an alignment cutting line; and dimensions of various parts of the first conductor 20 are further shown in FIG. 6. The dimensions of various elements shown in FIGS. 5A, 5B, and 6 are illustrated as follows: A1 is the length of an outer edge of the first main body 23, A is the length of an inner edge of the first main body 23, and B is the width of the first main body 23. D is the length of an inner edge of the first pin 21 or the second pin 22, and D1 is a vertical height of the sixth chamfer 42a. D2 is the length (as shown in FIG. 5A) by which the second protrusion portion 51c of the first removable alignment material 51 just contacts the very bottom of the fifth pin 41 and also denotes the length (as shown in FIG. 5B) by which the second protrusion portion 52c of the second removable alignment material 52 just contacts the very bottom of the sixth pin 42; D3 is the length between the bottom end of the first removable alignment material 51 and the very bottom of the fifth pin 41, and corresponding structural dimensions of the first removable alignment material 51 and the second removable alignment material 52 are identical, as shown in FIGS. 5A and 5B. E is the thickness of the first removable alignment material 51, and FIG. 6 shows that the thickness of the first removable alignment material 51 is identical with that of the first pin 21, the third pin 31, and the fifth pin 41. Likewise, the thickness of the second removable alignment material 52 is identical with that of the second pin 22, the fourth pin 32, and the sixth pin 42. E1 is the thickness of the first main body 23, F is the width of the very bottom of the second pin 22, G is an interval between the second main body 33 and the third main body 43, and θ in FIG. 5A is an inclination angle of the first chamfer 21a. These dimensions are shown in the following table 2:

TABLE 2

|  | Numeric values | Notes | Units |
| --- | --- | --- | --- |
| A | 18.65 | (Min) | mm |
| A1 | 20.75 | (Max) | mm |
| B | 2.0 | ±0.05 | mm |
| D | 2.15 | ±0.05 | mm |
| D1 | 1.00 | (Ref.) | mm |
| D2 | 1.5 | ±0.05 | mm |
| D3 | As required |  | mm |
| E | 1.00 | +0.03/−0 | mm |
| E1 | 1.05 | (Max) | mm |
| F | 1.0 | ±0.1 | mm |
| G | 1.0 | ±0.05 | mm |
| θ | 45° |  |  |

It can be learned from table 2 that, in the embodiment shown in FIG. 5A, the inclination angle of the first chamfer 21a is 45° in the embodiment shown in table 2. If the third chamfer 31a also has an inclination angle of 45° in this case, because the first chamfer 21a and the third chamfer 31a have different inclination directions, the above-described first direction X and second direction Y are perpendicular to each other when the two chamfers are both of 45°. However, the angle of 45° merely shows one embodiment, and the inclination angle θ of the chamfer in the present disclosure needs to be made as small as possible with the process and technique during actual production. That is, the angle θ of the present disclosure is not limited to 45°; and even may be less than 45°, such as 30°, 20°, or less, which probably more accurately meet the actual demands. On the other hand, when the inclination angle of the first chamfer 21a is 45° during implementation, the inclination angle of the second chamfer 22a is also 45°. An included angle between each of the third chamfer 31a, the fourth chamfer 32a, the fifth chamfer 41a, and the sixth chamfer 42a and the horizontal line may also be set to 45° or an inclination angle different from that of the first chamfer 21a or the second chamfer 22a, which is determined according to actual demands.

Figure 7A:
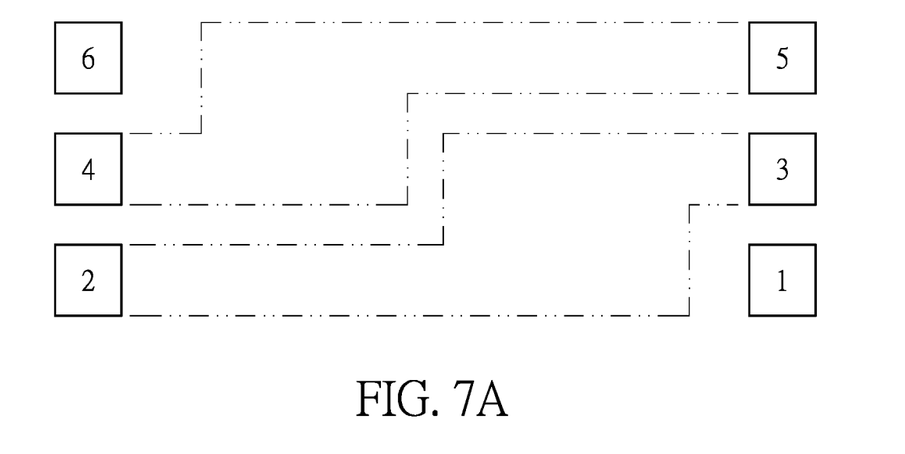
FIG. 7A is a schematic diagram of a layout of circuit board soldering pads in an actual application of an embodiment of the present disclosure.

As shown in FIG. 7A, FIG. 7A shows one of embodiments introducing a layout of soldering pads on a PCB board when the magnetic device 10 of the present disclosure is placed on the PCB board, where six boxes are shown and each represents one soldering pad. In FIG. 7A, the soldering pad numbered as 1 is corresponding to the first pin 21, the soldering pad numbered as 2 is corresponding to the second pin 22, the soldering pad numbered as 3 is corresponding to the third pin 31, the soldering pad numbered as 4 is corresponding to the fourth pin 32, the soldering pad numbered as 5 is corresponding to the fifth pin 41, and the soldering pad numbered as 6 is corresponding to the sixth pin 42. Therefore, by the layout of the soldering pads on the PCB board, the second pin 22 and the third pin 31 are connected, and the fourth pin 32 and the fifth pin 41 are connected.

On the other hand, the layout of the soldering pads in FIG. 7A is corresponding to the arrangement of the multiple pins and their corresponding chamfers shown in FIGS. 1, 2, 3, and 4C. Because the first chamfer 21a and the third chamfer 31a are opposite and the third chamfer 31a and the fifth chamfer 41a have the same orientations, a distance between the soldering pad numbered as 1 and that numbered as 3 is relatively wide, while a distance between the soldering pad numbered as 3 and that numbered as 5 is relatively narrow. However, in the embodiment shown in FIG. 4D, because the chamfers 21a, 22a, 31a, 32a, 41a, and 42a have the same orientations, the distance between the soldering pad numbered as 1 and that numbered as 3 is identical with the distance between the soldering pad numbered as 3 and that numbered as 5.

Figure 8A:
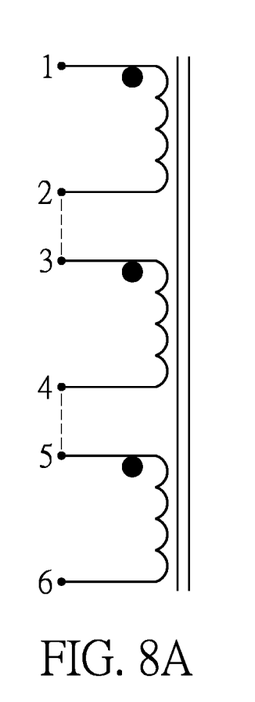
FIG. 8A is a schematic circuit diagram corresponding to the actual application of the embodiment in FIG. 7A in the present disclosure.

Refer to FIG. 8A, which is a circuit diagram corresponding to the circuit layout in FIG. 7A designed for the magnetic device 10 of the present disclosure. In FIG. 8A, a point numbered as 1 is corresponding to the soldering pad numbered as 1 in FIG. 7A, and the numerals in FIG. 8A are corresponding to those in FIG. 7A. Further, based on the foregoing embodiment in which the magnetic element 14 probably has three sets of coils, the magnetic device 10 of the present disclosure achieves the circuit characteristics shown in FIG. 8A by the circuit layout in FIG. 7A.

Figure 7B:
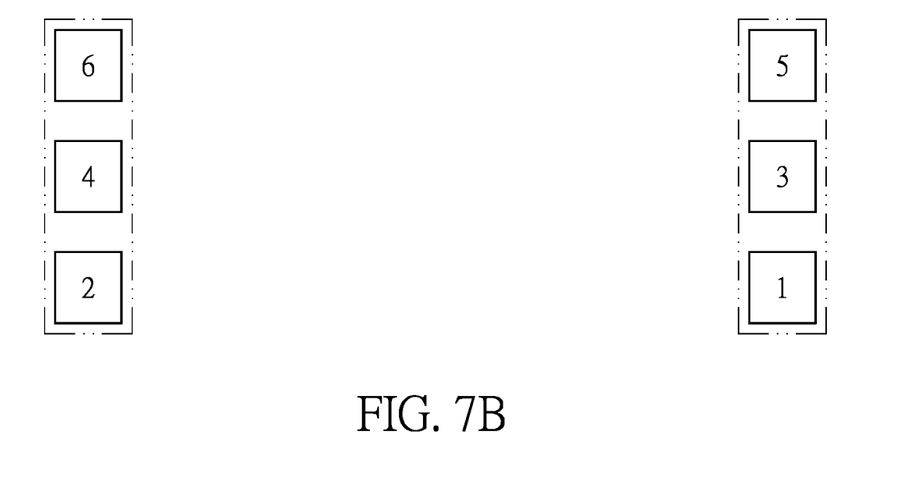
FIG. 7B is a schematic diagram of a layout of the circuit board soldering pads in an actual application of another embodiment of the present disclosure.
Figure 7C:
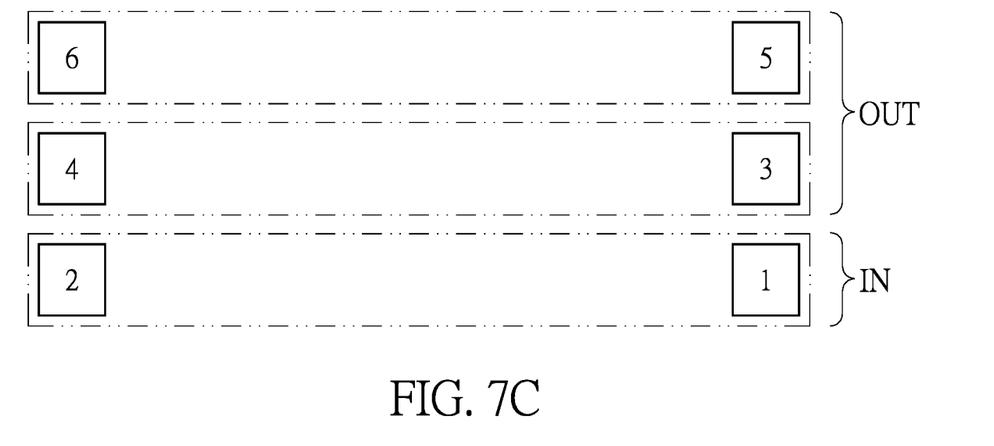
FIG. 7C is a schematic diagram of a layout of the circuit board soldering pads in an actual application of yet another embodiment of the present disclosure.
Figure 7D:
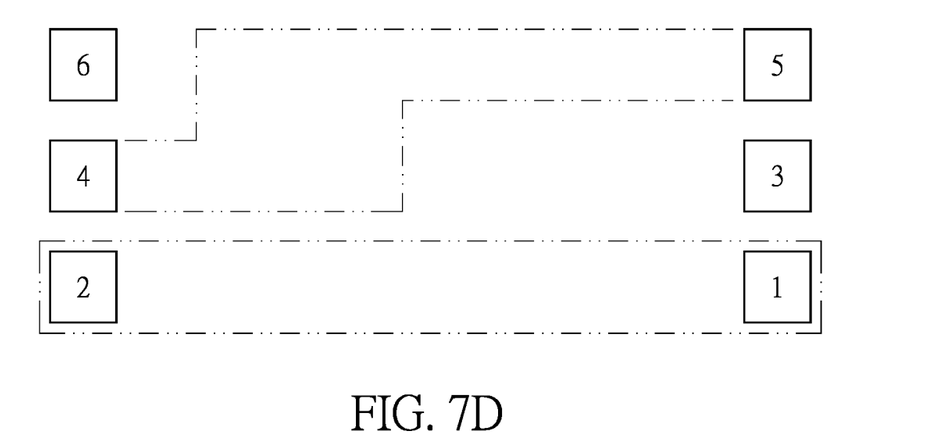
FIG. 7D is a schematic diagram of a layout of the circuit board soldering pads in an actual application of still another embodiment of the present disclosure.
Figure 8B:
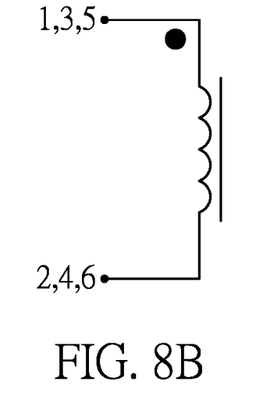
FIG. 8B is a schematic circuit diagram corresponding to the actual application of the embodiment in FIG. 7B in the present disclosure.
Figure 8C:
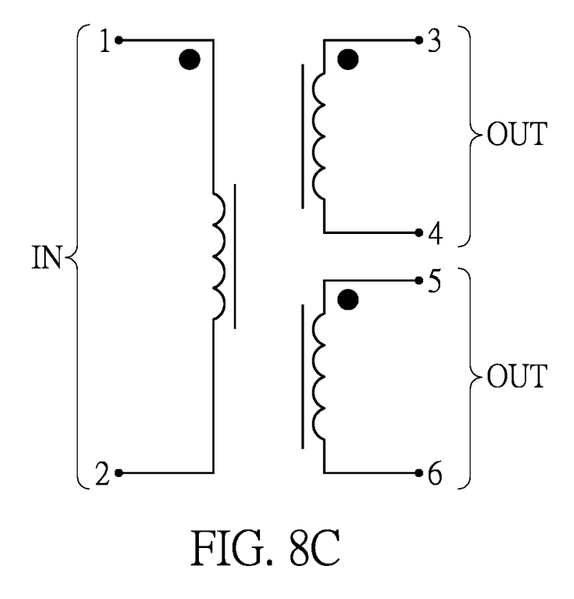
FIG. 8C is a schematic circuit diagram corresponding to the actual application of the embodiment in FIG. 7C in the present disclosure.
Figure 8D:
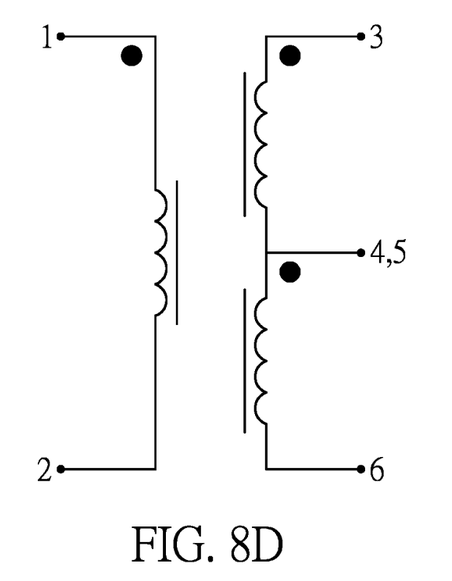
FIG. 8D is a schematic circuit diagram corresponding to the actual application of the embodiment in FIG. 7D in the present disclosure.

Further referring to FIGS. 7B and 8B, the soldering pads numbered as 1, 3, and 5 are connected and the soldering pads numbered as 2, 4, and 6 are further connected in FIG. 7B. In this way, when the magnetic device 10 of the present disclosure is mounted based on the circuit layout in FIG. 7B, an inductor circuit shown in the schematic diagram of FIG. 8B is formed. Referring to FIGS. 7C and 8C, the soldering pads numbered as 1 and 2 are connected and the soldering pads numbered as 3 and 4 are connected in FIG. 7C, and further the soldering pads numbered as 5 and 6 are connected. In this way, when the magnetic device 10 of the present disclosure is mounted on the circuit layout in FIG. 7C, a transformer circuit shown in the schematic diagram of FIG. 8C is formed. Referring to FIGS. 7D and 8D, the soldering pads numbered as 1 and 2 are connected and the soldering pads numbered as 4 and 5 are further connected in FIG. 7D. In this way, when the magnetic device 10 of the present disclosure is mounted based on the circuit layout in FIG. 7D, a transformer circuit shown in the schematic diagram of FIG. 8D is formed.

To sum up, the pin-aligned magnetic device of the present disclosure can effectively avoid pin misalignment in a magnetic element in the prior art, which enables the pins to be aligned at the bottom after completion of the whole product by a structural design of the pins, and by using removable alignment materials and then cutting them away together during the manufacturing process. Moreover, the pins can be heightened at the bottom, that is, the bottoms of the pins exceed the bottom of the magnetic device and extend downwards, thus making room at the bottom of the magnetic device and facilitating space saving and utilization on the PCB board. When the magnetic device of the present disclosure is placed on the PCB board with a mechanical appliance of an automated machine, all the pins can be in good contact with the PCB board, improving the electrical characteristics of the circuit product and further enhancing product yield on the production line. Therefore, it is apparent that the technical content of the present disclosure has extremely strong patent application requirements.

However, the content described herein merely gives examples of preferred embodiments of the present disclosure, and is not intended to limit the protection scope of the present disclosure. Any relevant partial changes, minor modifications or technical additions, or numerical or positional changes, etc. all shall fall within the protection scope of the present disclosure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A pin-aligned magnetic device, comprising:
   a first magnetic core body, internally disposed with a magnetic element;
   a second magnetic core body, disposed above the first magnetic core body; and
   a plurality of conductors, disposed between the first magnetic core body and the second magnetic core body, correspondingly joined to the magnetic element, and arranged at intervals, wherein the second magnetic core body covers the plurality of conductors on the first magnetic core body, so that the plurality of conductors is mounted inside the magnetic device and pins thereof are exposed from two lateral sides of the magnetic device; and a cut portion is formed only on a lateral side at a bottom of each of the pins, and the pins are aligned at the bottom.

2. The pin-aligned magnetic device of claim 1, wherein the plurality of conductors comprises:
   a first conductor, comprising a first main body, wherein the two ends of the first main body are vertically bent downwards to form a first pin and a second pin;
   a second conductor, comprising a second main body, wherein the two ends of the second main body are vertically bent downwards to form a third pin and a fourth pin; and
   a third conductor, comprising a third main body, wherein the two ends of the third main body are vertically bent downwards to form a fifth pin and a sixth pin.

3. The pin-aligned magnetic device of claim 1, wherein each of the cut portions forms a chamfer, and there are a first chamfer, a second chamfer, a third chamfer, a fourth chamfer, a fifth chamfer, and a sixth chamfer; the first chamfer and the second chamfer face a first direction, and the third chamfer, the fourth chamfer, the fifth chamfer, and the sixth chamfer face a second direction; the first direction is identical with normal directions of the first chamfer and the second chamfer, and the second direction is identical with normal directions of the third chamfer, the fourth chamfer, the fifth chamfer, and the sixth chamfer; and the first direction and the second direction intersect.

4. The pin-aligned magnetic device of claim 1, wherein each of the cut portions forms a chamfer; there are a first chamfer, a second chamfer, a third chamfer, a fourth chamfer, a fifth chamfer, and a sixth chamfer; and normal directions of the first chamfer, the second chamfer, the third chamfer, the fourth chamfer, the fifth chamfer, and the sixth chamfer are the same.

5. The pin-aligned magnetic device of claim 1, wherein each of the cut portion portions forms an inverted L-shaped notch, and all or some of these inverted L-shaped notches have the same orientations.

6. The pin-aligned magnetic device of claim 3, wherein an included angle between either of the first chamfer and the second chamfer and a horizontal line is 45°, and an included angle between each of the third to sixth chamfers and the horizontal line is also 45°.

7. The pin-aligned magnetic device of claim 3, further comprising a first removable alignment material and a second removable alignment material during manufacturing of the plurality of conductors, wherein a side of the first removable alignment material is connected to the first chamfer, the third chamfer, and the fifth chamfer, and pre-designed creases are provided at joints respectively; a side of the second removable alignment material is connected to the second chamfer, the fourth chamfer, and the sixth chamfer, and pre-designed creases are also provided at joints respectively.

8. The pin-aligned magnetic device of claim 7, wherein the first removable alignment material comprises:
   a base;
   a first protrusion portion, protruding and extending upwards from an upper left side of the base, wherein two lateral sides of a top end of the first protrusion portion are exactly joined to the first chamfer and the third chamfer respectively; and
   a second protrusion portion, protruding and extending upwards from an upper right side of the base, wherein a top end of the second protrusion portion is exactly joined to the fifth chamfer.

9. The pin-aligned magnetic device of claim 7, wherein the second removable alignment material comprises:
   a base;
   a first protrusion portion, protruding and extending upwards from an upper right side of the base, wherein two lateral sides of a top end of the first protrusion portion are exactly joined to the second chamfer and the fourth chamfer; and
   a second protrusion portion, protruding and extending upwards from an upper left side of the base, wherein the a top end of the second protrusion portion is joined to the sixth chamfer.

* * * * *